United States Patent [19]

Petropoulos et al.

[11] Patent Number: 5,952,830
[45] Date of Patent: Sep. 14, 1999

[54] OCTAPOLE MAGNETIC RESONANCE GRADIENT COIL SYSTEM WITH ELONGATE AZIMUTHAL GAP

[75] Inventors: Labros S. Petropoulos, Solon; Nicholas J. Mastandrea, Euclid; Mark A. Richard, South Euclid, all of Ohio

[73] Assignee: Picker International, Inc., Highland Heights, Ohio

[21] Appl. No.: 08/996,435

[22] Filed: Dec. 22, 1997

[51] Int. Cl.⁶ ........................................... G01V 3/00
[52] U.S. Cl. ............................................... 324/318
[58] Field of Search ................................. 324/318, 322, 324/314, 300, 307, 309

[56] References Cited

U.S. PATENT DOCUMENTS

| 5,304,933 | 4/1994 | Vavrek et al. | 324/318 |
| 5,378,989 | 1/1995 | Barber et al. | 324/318 |
| 5,574,373 | 11/1996 | Pausch et al. | 324/318 |
| 5,585,724 | 12/1996 | Morich et al. | 324/318 |
| 5,675,305 | 10/1997 | DeMeester et al. | 335/302 |
| 5,729,141 | 3/1998 | Hass et al. | 324/318 |
| 5,736,858 | 4/1998 | Katznelson et al. | 324/316 |
| 5,804,968 | 9/1998 | Richard et al. | 324/318 |

*Primary Examiner*—Louis Arana
*Attorney, Agent, or Firm*—Fay, Sharpe, Beall, Fagan, Minnich & McKee, LLP

[57] ABSTRACT

A magnetic resonance imaging apparatus (10) includes a primary magnet assembly for generating a temporarily constant magnetic field through an examination region (20), a gradient coil assembly for inducing magnetic field gradients across the examination region (20), and a radio frequency coil for receiving resonance signals from the examination region. The gradient coil assembly includes a coil carrying member (22) carrying first (44) and second (46) spaced apart gradient coil portions which are physically separated from each other on the coil carrying member to define at least one azimuthally directed gap (48, 50, 52, 54) extending along the coil carrying member between said first and second gradient coil portions. The first and second coil portions are disposed towards opposite top and bottom sides of the examination region and have internal windings therein for generating gradient magnetic field components along at least two mutually orthogonal axes (X, Y) in the examination region.

15 Claims, 15 Drawing Sheets

OCTAPOLE MAGNETIC RESONANCE GRADIENT COIL SYSTEM WITH ELONGATE AZIMUTHAL GAP

BACKGROUND OF THE INVENTION

The present invention relates to the magnetic resonance imaging arts. It finds particular application in conjunction with horizontal open magnet imaging equipment of the type used to perform interventional procedures on the torso and head of human subjects and will be described with particular reference thereto. It is to be appreciated, however, that the present invention also finds application in conjunction with imaging and interventional procedures performed on other human body parts and further, in conjunction with the imaging or analysis of non-human and inanimate subjects.

In magnetic resonance imaging, dipoles are selectively aligned with a primary magnetic field. Radial frequency excitation pulses are applied to stimulate resonance in the aligned dipoles and radio frequency magnetic resonance signals are collected from the resonating dipoles. Gradient magnetic field pulses are applied to encode spatial position. When imaging the human upper torso, which includes the heart, lungs, and other moving tissue, high speed image acquisition is essential.

To promote high speed image acquisition and high resolution, high strength magnetic field gradients with high slew rates are advantageous. That is, gradients of large magnitude that can be switched on and off very quickly are desirable for improved data acquisition time and resolution. However, gradient strength varies inversely as the radius squared of the gradient coil. Stored energy, a critical factor for slew rate, varies with the fifth power of the radius of the gradient coil. Thus, for upper torso imaging using large diameter coils, the width of the patient's shoulders has been a limiting factor in prior systems. Typically, a whole body gradient magnetic field coil is about 65 cm in diameter. To improve the magnetic field gradient characteristics in the upper torso while minimizing the adverse effects of large diameter sizes, elliptical gradient coils and planar gradient coils have been utilized with some success.

To improve data acquisition speed and resolution in other parts of the human anatomy, smaller diameter gradient coils have been used, e.g., smaller diameter head or wrist coils. Typical head coils are on the order of 30 cm in diameter and wrist coils are smaller yet.

One major drawback of whole body coils, insertable coils, and local coils of the general type described above, is that they limit access to the examined patient. The gradient coils substantially surround the examined region. In order for a physician to gain access to the examined region, such as to perform a biopsy or other interventional procedure, the patient must be removed from within the gradient coil assembly. Moving the patient relative to the gradient coil assembly also moves the patient relative to the resultant image obtained from the coil assembly. The moved patient needs then to be re-registered with the diagnostic image before performing any interventional procedures.

An alternative coil design having a plurality of access ports defining holes through the gradient coil has been proposed in U.S. Pat. No. 5,304,933 to Vavrek, et al. In the Vavrek, et al. system, the local gradient coil is adapted for use with a stereotaxic device and includes an opening in the coil form positioned to minimize the destruction of the gradient fields and a mechanical slide bearing for moving the form with respect to the stereotaxic frame so that the opening may be limited in area and yet provide essentially unrestricted linear access to the patient. The windings in the neighborhood of the opening are diverted by modifying the stream function of the windings in a manner to minimize the effect of the opening on the resultant gradient field. However, one problem with the Vavrek, et al. system is that a significant level of undesirable torque is generated when the coil is operated in a uniform static magnetic field. In addition, the gradient coil layout in the Vavrek, et al. system is designed or specified using a "forward approach method," thus realizing a coil configuration having a desirable asymmetric current distribution but capable of generating only marginally acceptable levels of gradient strength and slew rate.

As shown in the Vavrek, et al. patent drawings, the access holes are quite small and therefore provide only modest access to the patient within the coil. The Vavrek, et al. coil design does not allow for building both the X and Y transverse coils on the same coil carrying member radius for improved linearity. Further, the Vavrek, et al. design does not enable a two-part coil assembly such as a system of the type having a removable split top coil to facilitate easy patient receipt and exiting from the magnetic resonance imaging system.

Another alternative approach to the prior closed gradient coil systems is suggested in U.S. Pat. No. 5,378,989 to Barber, et al. This configuration proposes a pair of axially spaced apart cylindrical gradient coil carrying members separated by a distance defining an interventional access area. A patient is disposed within the bores of the coil carrying members in axial alignment therewith. The Barber, et al. system is constructed such that large portions of current patterns disposed near the isocenter of the transverse coils are flared radially outward in order to permit an opening at the center of the magnet and along the axial direction.

Generally, such an arrangement generates a gradient set which is suitable for interventional applications but has very poor gradient field strength and slew rate performance. In addition, primarily due to the flared current pattern described above, one further disadvantage of the Barber, et al. system is very poor rise time performance. Therefore, the Barber, et al. system cannot be used for real time needle tracking or for any fast imaging techniques because of the poor gradient performance and slow rise time of the overall coil set attributable mainly to the "forward approach method" used to specify the coil conductor layout. Lastly, as with the Vavrek, et al. system described above, the Barber, et al. coil design does not allow for building both X and Y transverse coils on the same coil carrying member radius and, further, does not enable a two-part coil assembly of the type having a removable split top coil to facilitate easy patient receipt and exiting from the magnetic resonance imaging apparatus.

Morich, et al. in their U.S. Pat. No. 5,585,724 assigned to the assignee of the present invention, propose yet another alternative to the prior closed gradient closed systems wherein an axially directed interstitial gap is provided between a set of coil pairs to define an interventional access area. A coil arrangement of the type described in the Morich, et al. patent is particularly well suited for interventional applications in open magnet systems having horizontally directed main magnetic fields. However, the gradient performance of the Morich, et al. design is somewhat limited in both gradient strength and rise time.

The present invention provides a new and improved gradient magnetic coil assembly for magnetic resonance imaging which overcomes the above-referenced problems and others.

SUMMARY OF THE INVENTION

In accordance with the present invention, a magnetic resonance imaging apparatus is provided. A primary magnet assembly generates a temporally constant magnetic field through an examination region. A gradient coil assembly induces magnetic field gradients across the examination region. A radio frequency coil receives resonance signals from the examination region. The gradient coil includes first and second spaced apart gradient coil portions which are physically separated from each other on a coil carrying member to define at least one azimuthally directed gap extending along the coil carrying member between the first and second gradient coil portions. The first and second gradient coil portions are disposed towards opposite top and bottom sides of the examination region. Each of the first and second gradient coil portions include internal windings for generating gradient magnetic field components along at least two mutually orthogonal axes in the examination region.

In accordance with a more limited aspect of the present invention, the coil carrying member is substantially circularly cylindrical and the first and second gradient coil portions are substantially circularly semi-cylindrical.

In accordance with another more limited aspect of the present invention, the first gradient coil portion defines a top circularly semi-cylindrical shell portion of the gradient coil assembly and, the second gradient coil portion defines a bottom circularly semi-cylindrical shell portion of the gradient coil assembly.

In accordance with yet another more limited aspect of the present invention, the bottom circularly semi-cylindrical shell portion of the gradient coil assembly is adapted to be fixedly mounted to a patient support in the magnetic resonance imaging apparatus. The top circularly semi-cylindrical shell portion of the gradient coil assembly is removable from the bottom shell portion whereby, the top shell portion is selectively removable to facilitate patient receipt and exiting from the magnetic resonance imaging apparatus.

In accordance with yet another more limited aspect of the present invention, the internal windings in the first and second gradient coil portions are disposed on the coil carrying member in a non-overlapping fashion.

One advantage of the present invention is an improvement in gradient field strength and slew rate whereby the resolution of the imaged subject is greatly improved.

Another advantage of the present invention resides in improved imaging speeds and reduced data acquisition times.

Another advantage of the present invention is that it facilitates access to the examined region of the patient, while the patient is disposed in a known relationship to the gradient magnetic field coils.

Yet another advantage of the present invention is the construction of a gradient magnetic field coil assembly in a snap together shell arrangement whereby the top shell is removable from the bottom shell to facilitate patient receipt and exiting from the magnetic resonance imaging apparatus.

Still yet another advantage of the present invention is an improvement in the linearity of the gradient magnetic field coil assembly due to the transverse coils being disposed at equal radius distances on the coil carrying assembly.

Still further advantages of the present invention will become apparent to those of ordinary skill in the art upon reading and understanding the following detailed description of the preferred embodiments

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
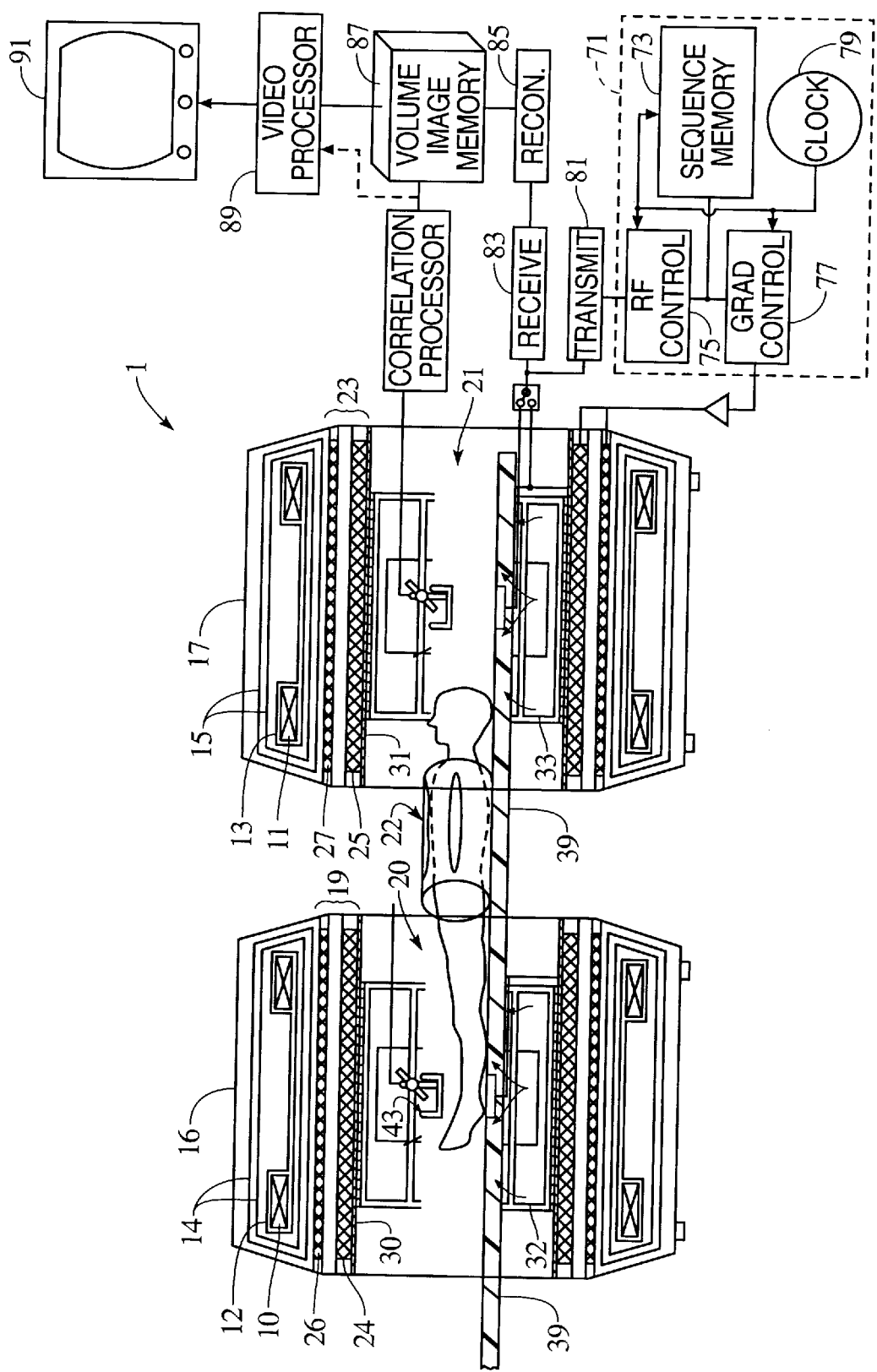
FIG. 1 is a diagrammatic illustration of an open magnetic resonance imaging system using an octapole gradient coil system in accordance with the present invention.

With reference to FIG. 1, an open or "double doughnut" type magnetic resonance imaging system 1 includes main or primary magnets 10, 11. Preferably, the main or primary magnets are annual superconducting magnets disposed adjacent opposite ends of the assembly within liquid helium cans 12, 13. The liquid helium cans and the magnets are surrounded by a plurality of cold shields 14, 15 which assist in maintaining the superconducting magnets at superconducting temperatures while minimizing helium boil off. The magnet assemblies are surrounded by a pair of toroidal vacuum dewars 16, 17. The magnets 10, 11 are spaced apart to provide access to the patient. The helium cans, cold shields, and vacuum dewars are preferably separately closed to maintain their integrity.

The vacuum dewars and the magnet assemblies define a pair of central bores 20, 21. A gradient coil assembly, preferably self-shielded whole body gradient coil assemblies 19, 23 are disposed around an outer periphery of the bore 20, 21. In the illustrated embodiment, the whole body gradient coil assemblies 19, 23 include primary gradient coil assemblies 24, 25 within the bore which include X, Y, and Z whole body gradient coil windings for generating magnetic field gradients along X, Y, and Z directions. A shield gradient coil assembly 26, 27 is disposed within the vacuum dewar for canceling the magnetic field gradients emanating toward the main magnetic assembly. A radio frequency shield 30, 31 lines an inner surface of the gradient coil assembly. The radio frequency shield is transparent to gradient (kHz) range magnetic fields but is opaque to radio frequency (Mhz) signals. Whole body radio frequency coils 32, 33, such as bird cage style coils, are disposed around the inner surface of the radio frequency shield 30, 31 surrounding the bore 20, 21.

A retractable patient support 39 supports a subject to be examined and an insertable gradient coil assembly 22 formed in accordance with the present invention. The patient support includes a supporting surface in a substantially horizontal plane as shown. The supporting surface has a longitudinal axis lengthwise therealong and a perpendicular transverse axis thereacross, both in the horizontal plane. The supporting surface is slidably mounted on a patient support frame to provide a means for moving the supported surface in the horizontal plane. Preferably, a motor drive (not shown) is mounted to the frame to drive the patient supporting surface therealong.

Figure 2:
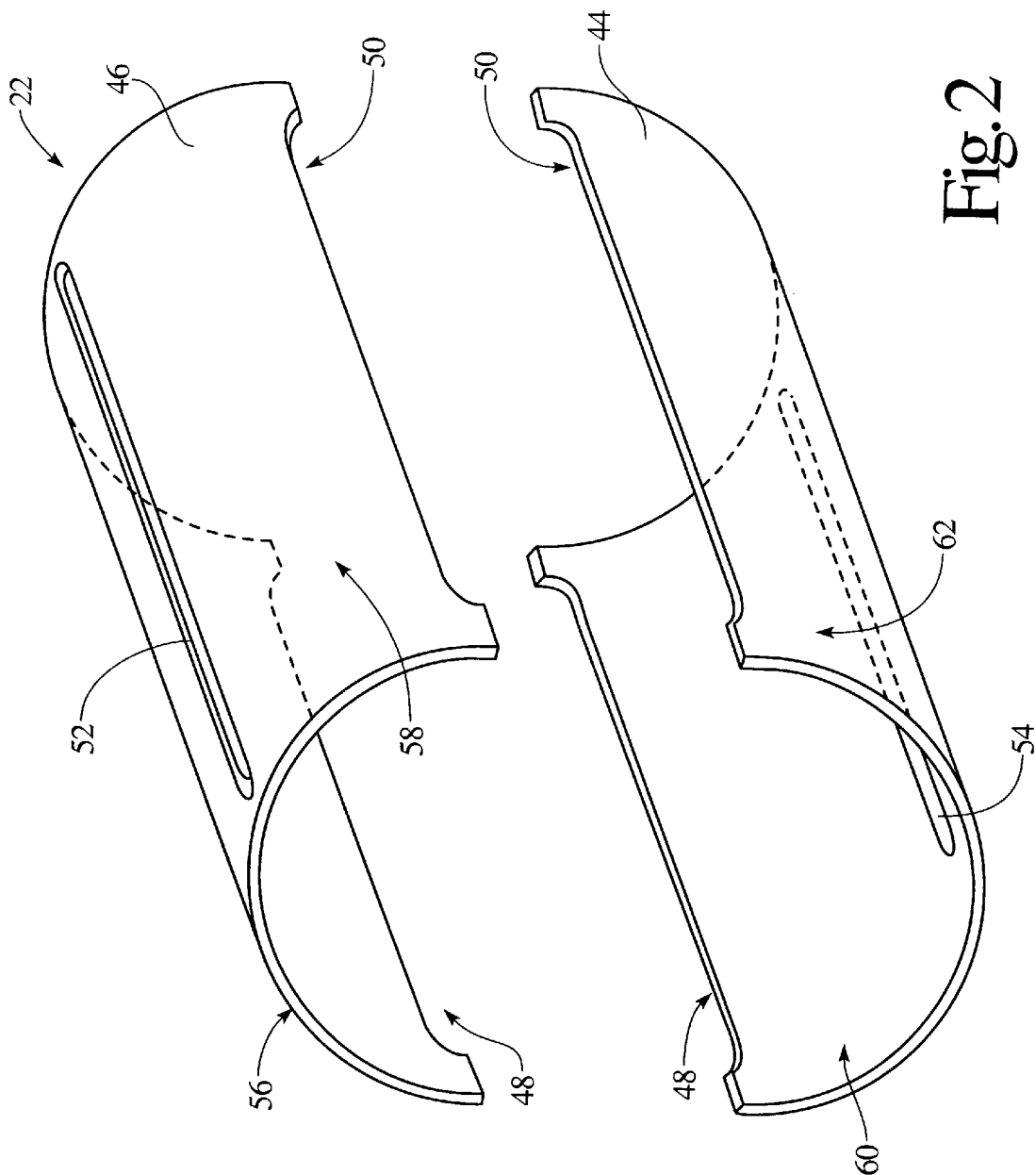
FIG. 2 is an expanded view of the split top octapole gradient coil assembly of FIG. 1.
Figure 3:
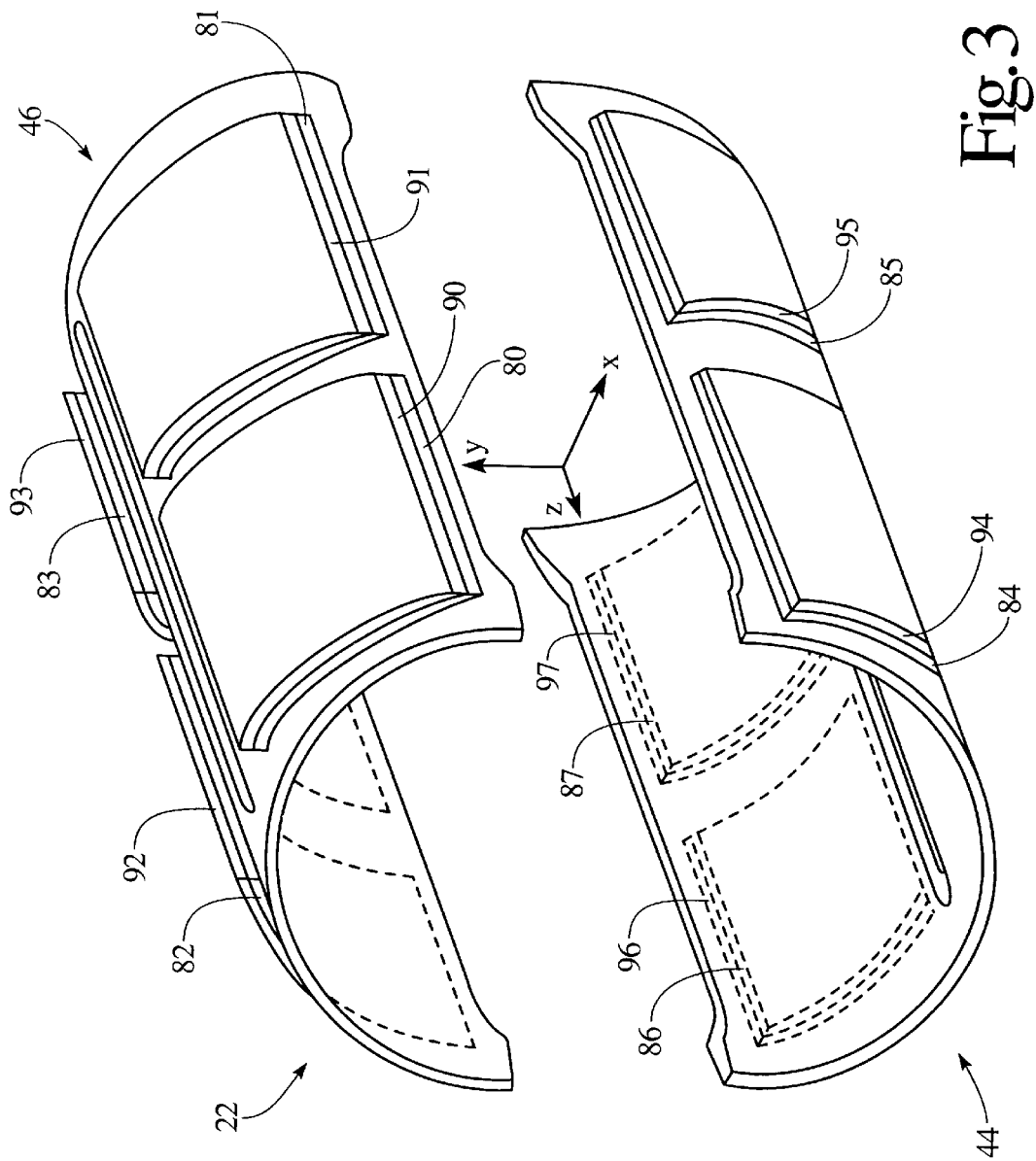
FIG. 3 is an expanded view of the split top coil assembly shown in FIG. 2 and illustrating a first preferred gradient coil arrangement on the coil carrying members wherein the coils are arranged in a stacked relationship.
Figure 4:
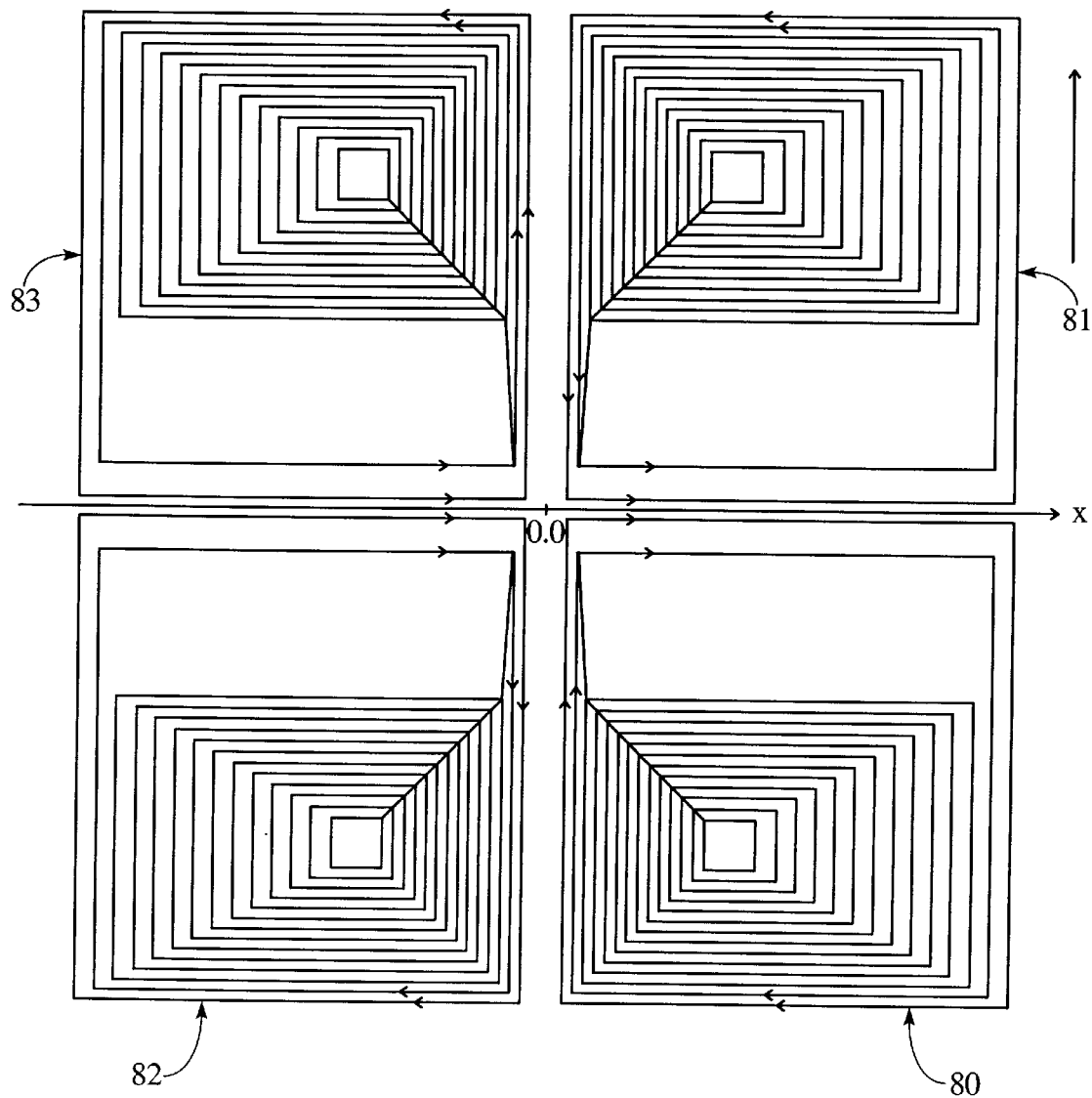
FIG. 4 is a flat illustration of a representative bunched coil pattern of a transverse gradient coil with an azimuthal gap from FIG. 3.
Figure 5:
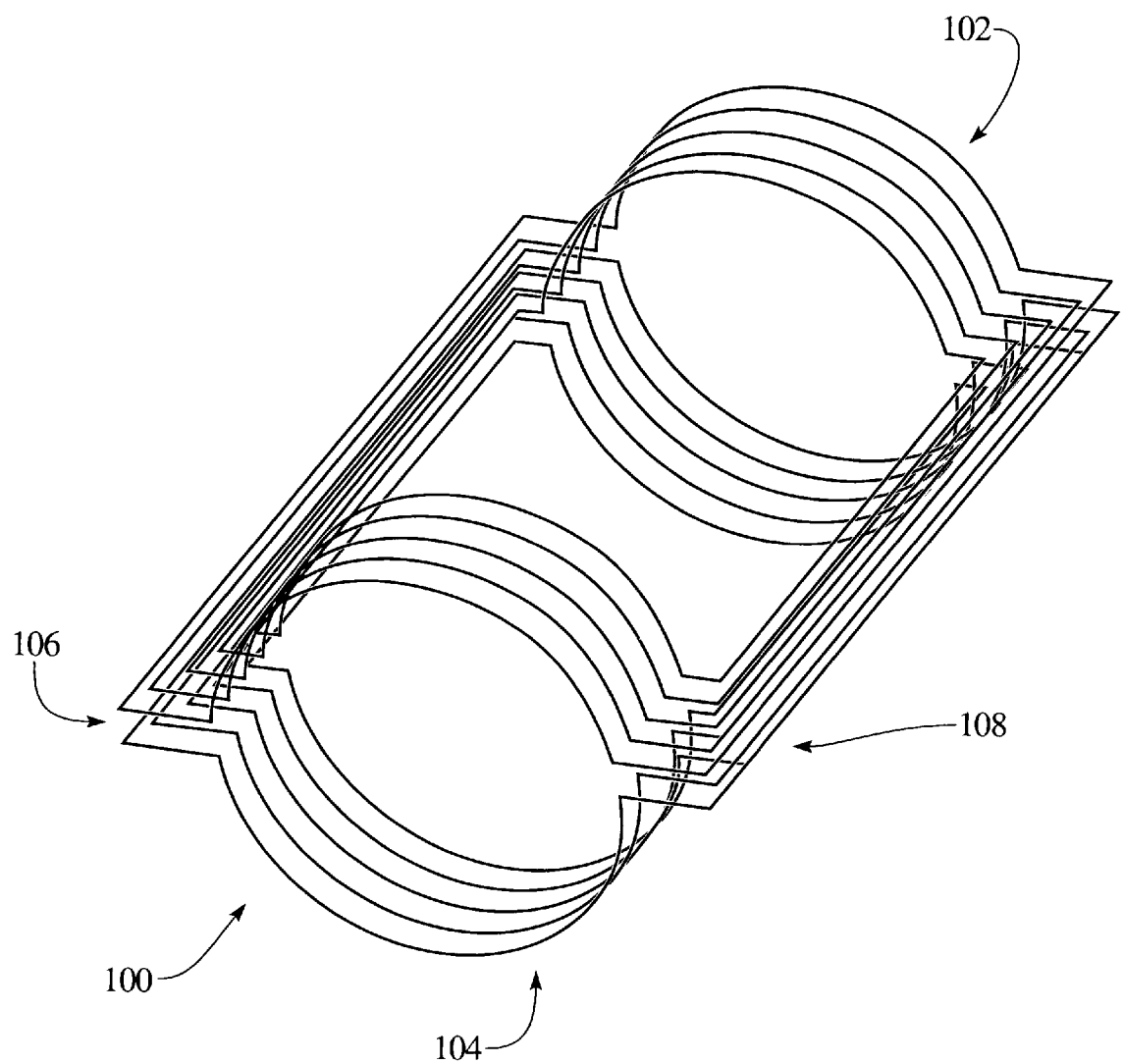
FIG. 5 is a schematic illustration of the Z-axis coil according to the present invention constructed on the split top gradient coil assembly of FIG. 2.
Figure 6:
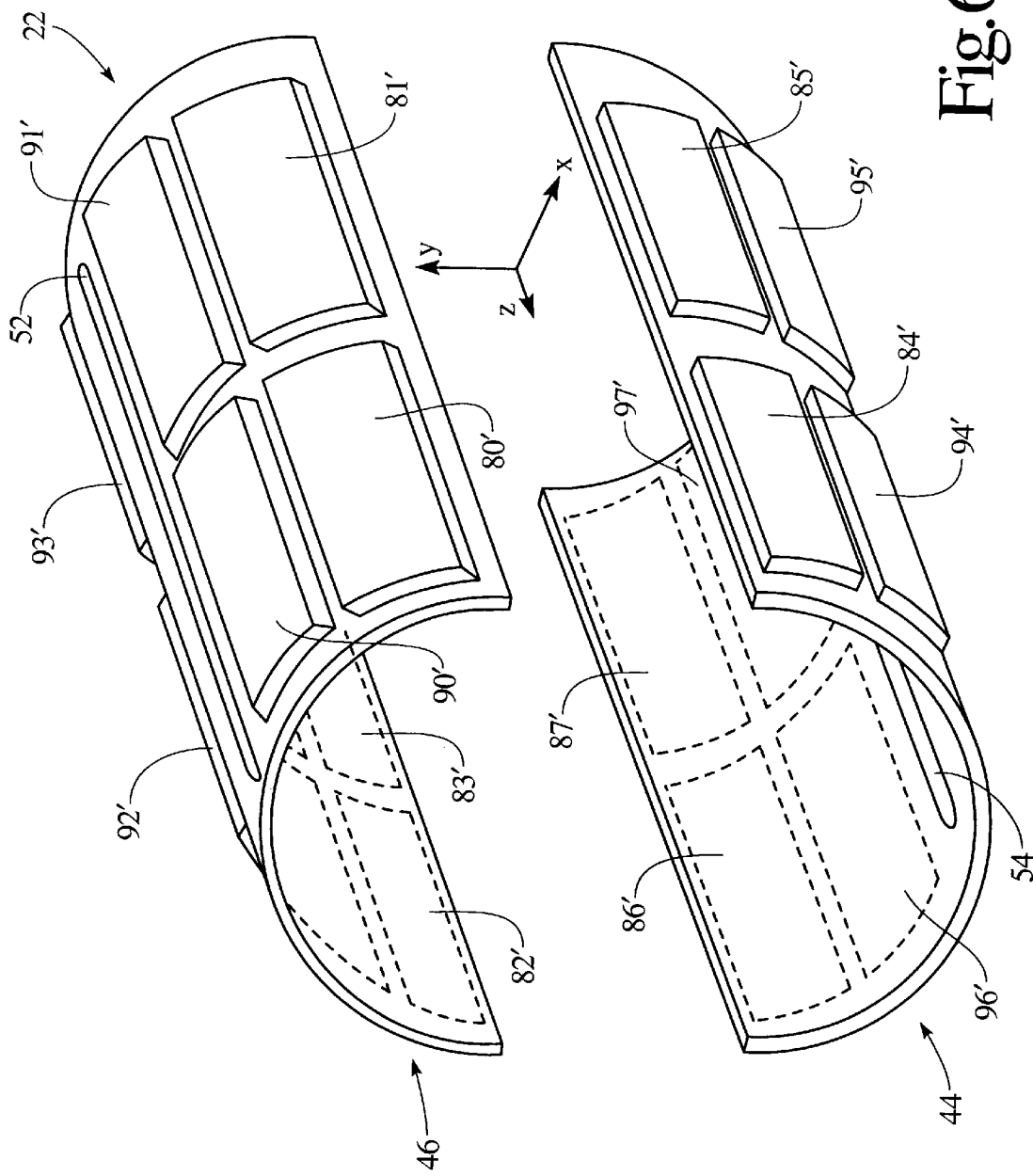
FIG. 6 is an expanded view of the split top gradient coil assembly shown in FIG. 2 and illustrating a second preferred gradient coil arrangement on the coil carrying members wherein the coils are constructed to fit upon the same radius.
Figure 7:
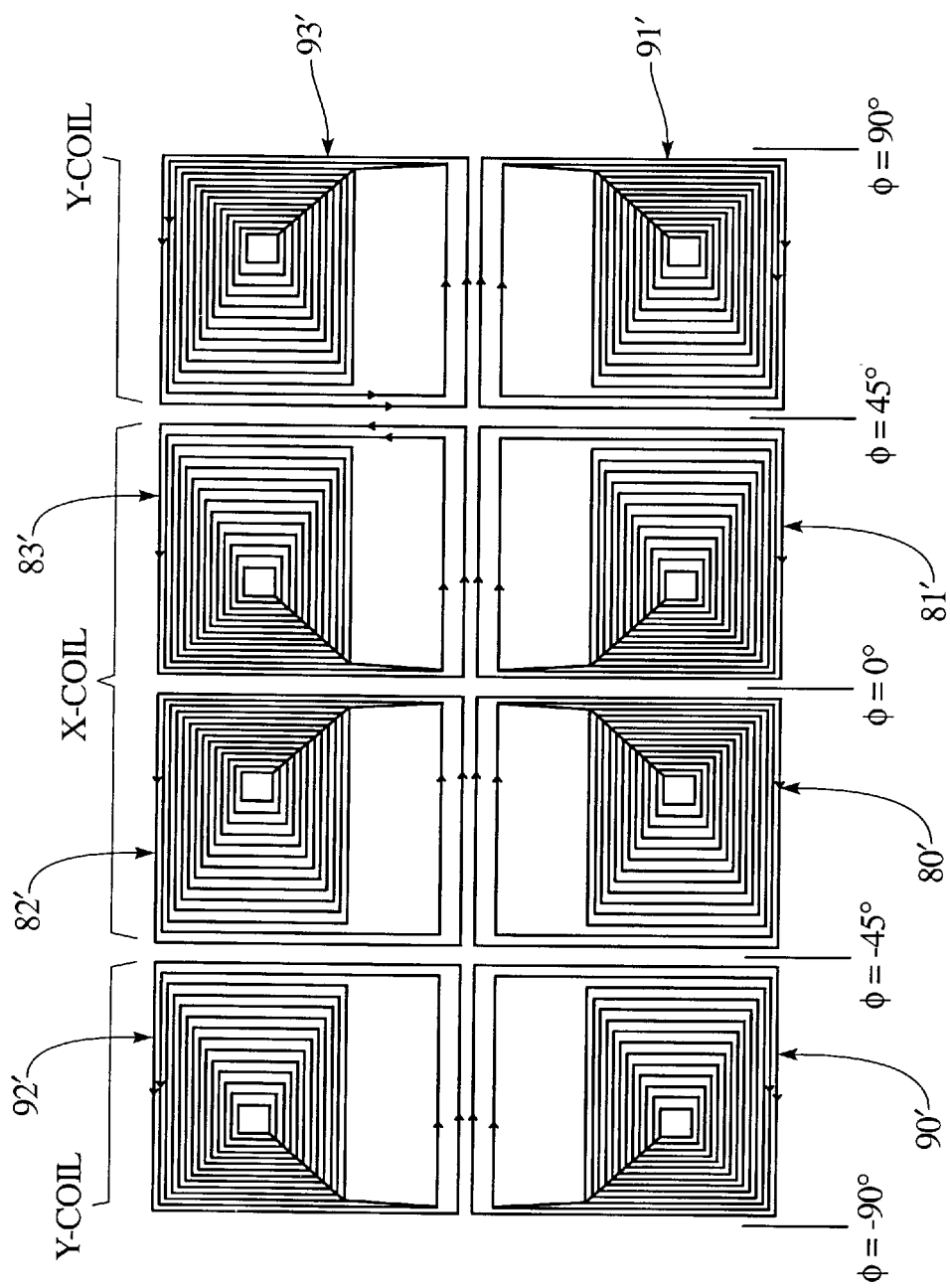
FIG. 7 is a flat illustration of a representative bunched coil pattern of transverse gradient coils constructed to fit upon the same radius as in FIG. 6.

With continuing reference to FIG. 1 and with further reference to FIG. 2, the insertable gradient coil assembly 22 includes a lower portion 44 which is mounted to the patient support 39. An upper, selectively removable portion 46 is electrically and mechanically interconnected with the lower portion 44 for imaging and is released and removed to facilitate patient access. In the preferred embodiment, the upper and lower gradient coil assemblies 46, 44 are constructed on a rigid dielectric former. The upper and lower assemblies together carry a pair of X-gradient coil assemblies as illustrated in FIGS. 4 and 7 according to a first preferred embodiment and a pair of Y-gradient coil assemblies also as illustrated in FIGS. 4 and 7 according to a first preferred embodiment. In the first preferred embodiment for horizontal main field imaging systems, the X and Y-gradient coils are arranged on the formers substantially as shown in FIGS. 3 and 6. Z-gradient coils in the form of annular loops are also carried by the dielectric formers preferably in a manner as shown in FIG. 5. In the first and alternative preferred embodiments, the X and Y-gradient coils are constructed of copper foil laminated to the dielectric former. Electrical connectors, such as metal pins and sockets, are mounted in the upper and lower former portions for providing electrical continuity between coil portions on the upper and lower coil portions when the coil portions are assembled together.

In operation, a sequence control 71 generates the appropriate gradient and radio frequency pulses of a selected magnetic resonance imaging sequence. More specifically, the characteristics of a selected magnetic resonance imaging sequence are withdrawn from a sequence memory 73 and stored and used to control a radio frequency sequence controller 75 and a gradient pulse controller 77. A common clock 79 clocks the radio frequency and gradient controllers simultaneously. The selected radio frequency pulse signals are conveyed to a radio frequency transmitter 81 which is selectively connectable to the whole body radio frequency coil 33 and to an insertable radio frequency coil.

After magnetic resonance is induced, the insertable radio frequency coil or a surface coil (not shown) receives the magnetic resonance signal and conveys it to a digital receiver 83. The digital receiver 83 demodulates and digitizes the magnetic resonance signal. A reconstruction processor 85 reconstructs the received magnetic resonance signals into a volumetric or slice image representation. A volume image memory 87 stores one or a series of image representations from the reconstruction processor. A video processor 89 converts the selected portions of the image representation in the image memory 87 into appropriate format for display on a monitor 91. For example, the video processor may convert selected slices of an imaged volume into appropriate format for display. As another option, the video processor can select the corresponding slice in a series or temporally displaced images of the heart to provide a cine image representation which simulates a motion picture of the selected slice of the heart as the heart is beating. As yet another example, the video processor can assemble a three-dimensional rendering of a selected organ or region.

With continued particular reference to FIG. 2, the insertable gradient coil assembly 22 includes a bottom half gradient coil portion 44 and a top half gradient coil portion 46 as described generally above. The top and bottom half portions are substantially separated by a pair of left and right axially extending elongate access apertures 48, 50. The left and right access apertures are preferably circumferentially spaced apart by about 180° on the cylindrical coil assembly 22 as shown. Each of the top and bottom half portions 46, 44 are additionally respectively substantially bisected by a top axially extending elongate aperture 52 and a bottom axially extending elongate access aperture 54. The top and bottom access apertures are also preferably circumferentially spaced apart by about 180° on the cylindrical coil assembly 22 as shown. The top access aperture 52 divides the top half gradient coil portion 46 into a top left coil portion 56 and a mirror image top right coil portion 58. Similarly, the bottom access aperture 54 divides the bottom half gradient coil portion 44 into a bottom left coil portion 60 and a mirror image bottom right coil portion 62. The apertures are formed by a set of azimuthal gaps defining a set of elongate circumferentially spaced apart ports extending along the entire length of the coil assembly to provide an interventionist access to a patient received within the closed coil assembly. Further, the top half portion 46 is electrically and mechanically interconnected with the bottom half portion 44 for imaging and is released and removed to facilitate patient entry and exit from the coil assembly. Preferably, the bottom and top half gradient coil portions 44, 46 are constructed on a rigid dielectric former.

Turning now to FIGS. 3 and 4, a first preferred transverse gradient coil arrangement according to the present invention will be described. In the first preferred embodiment, each of the bottom and top half gradient coil portions 44, 46 carry four X-gradient coil members and four Y-gradient coil members, respectively. The gradient coil members are constructed from copper sheets which are either machined or etched into the desired patterns as shown. The sheets are preferably bonded to an FR-4 backing material and are arranged on the bottom and top half gradient coil portions substantially as shown in the FIGURE. More particularly, the top half gradient coil portion 46 carries four discrete X-gradient coil members 80–83 generally as shown. In a similar fashion, the bottom half gradient coil portion 44 carries a corresponding set of X-gradient coil members 84–87 in a mirror image substantially as shown. The preferred bunched coil patterns for the first set of X-gradient coil members 80–83 carried on the top half gradient coil portion 46 are shown in FIG. 4. The other X-gradient coil members 84–87 disposed on the bottom half gradient coil portion 44 are preferably constructed substantially as shown in FIG. 4 as well.

With continued reference to FIG. 3 in particular, the top half gradient coil portion 46 carries four discrete Y-gradient coil members 90–93 generally as shown. In a similar fashion, the bottom half gradient coil portion 44 carries a corresponding set of Y-gradient coil members 94–97 in a mirror image substantially as shown. As shown in FIG. 3, the Y-gradient coil members 90–97 are stacked onto the X-gradient coil members 80–87. However, alternatively, the X-gradient coil members may be stacked on the Y-gradient coil members or, as yet another alternative, the stacking arrangement between the X and Y-gradient coil members may be randomly or evenly distributed over the insertable gradient coil assembly 22.

Turning now to FIG. 5, a schematic illustration of the Z-axis coil assembly constructed on the split top gradient coil assembly of FIG. 2 according to the present invention will now be described. The Z-axis coil 100 includes a top set of Z-axis coil members 102 and a corresponding mirror image bottom set of Z-axis coil members 104. Electric current flowing through the top and bottom set of Z-axis coil members 102, 104 cooperate to generate the Z-axis gradient field in a well known manner. Preferably, the Z-axis coil is constructed from copper sheets which are either machined or etched into the desired pattern shown. The machined or etched copper sheets are then bonded to an FR-4 backing material and are then rolled or bent into the desired shape shown in FIG. 6. As would be appreciated by those skilled in the art, the Z-axis pattern could also be constructed by abrasive water jet cutting or by wire winding or the like. Further, although FIG. 5 illustrates a single reversal in the Z-axis windings occurring at the isocenter of the coil, other designs could be easily accommodated. The returns are routed along left and right flanges 106, 108 as shown so that the field from the top and bottom sets 102, 104 cancel. Although each half of the Z-axis coil will separately generate a net torque, this torque is constrained in the preferred embodiment by alignment pins and latching mechanisms located in the flanges of the gradient coil formers described below in greater detail with reference to FIGS. 8 and 9.

Turning now to FIGS. 6 and 7, a second preferred transverse gradient coil arrangement for use with imaging equipment generating horizontally directed fields will now be described. In FIG. 6, each of the bottom and top half gradient coil portions 44, 46 carry four X-gradient coil members and four Y-gradient coil members, respectively. In this second preferred embodiment, both the X and Y-gradient coil members are radially co-located on the gradient coil former in a manner substantially as shown. That is, the coils are constructed to fit upon the same radius. One advantage is an increase in the available patient aperture space. In addition, the radial co-location of the X and Y transverse gradient coil members allows for a decrease in size of the overall gradient coil assembly structure since only a single set of gradient coils need to be constructed rather than two overlapping sets as was traditionally required.

In the second preferred embodiment shown, the top half coil portion 46 carries four discrete X-gradient coil members 81'–83' and four discrete Y-gradient coil members 90'–93' generally as shown. In a similar fashion, the bottom half gradient coil portion 44 carries a corresponding set of X-gradient coil members 84'–87' and a set of Y-gradient coil members 94'–97' in a mirror image substantially as shown. The coil members are preferably constructed from machined or etched copper sheets and then bonded together substantially as described above.

Overall, the X and Y-gradient coil members are symmetrically spaced apart and disposed over the gradient coil assembly 22 for the purpose of minimizing the effects of net torque on the coil structures. As shown, the coil members experience no net torque effects. This significantly reduces the coil vibration which is normally present in coil structures having non-symmetric current patterns. As a result, the medical image acquired in the magnetic resonance imaging system has only minimum distortion and minimum ghosting effects.

In addition to the above, since the current distribution of the coil arrangements shown in FIGS. 4 and 7 advantageously permit the coils to be disposed over the entire length of the gradient coil assembly 22, there are none of the space limitations that are typically encountered in prior art gradient coil systems of the type described above by way of background. As a direct result, the required stored magnetic energy of the present invention is substantially lower than the required stored magnetic energy in prior art systems. As TABLE 3 below indicates, the octapole gradient coil with azimuthal gap of arbitrary width in accordance with the present invention has double the slew rate on 30% reduced length as compared against the prior art coil assembly of Morich, et al. In addition, the gradient coil arrangements according to the present invention generate six times the gradient strength and two hundred times the slew rate of the Vavrek, et al. open gradient coil system described generally above.

Figure 8:
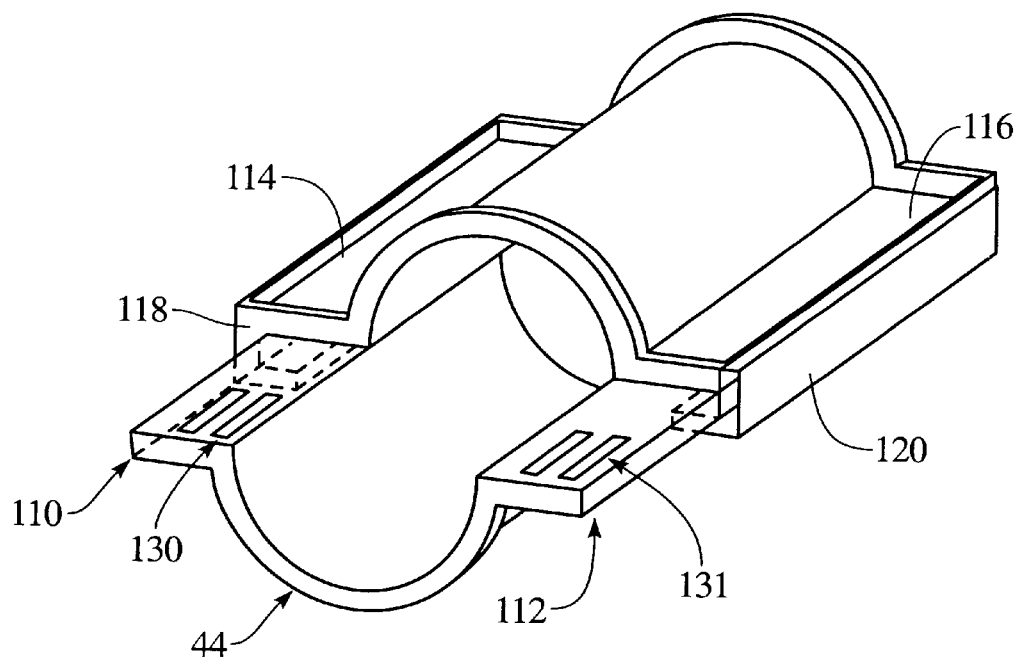
FIGS. 8 and 9 are schematic illustrations of alternative sliding top and hinged top constructions respectively for connecting the split top octapole gradient coil system shown in FIG. 2.
Figure 9:
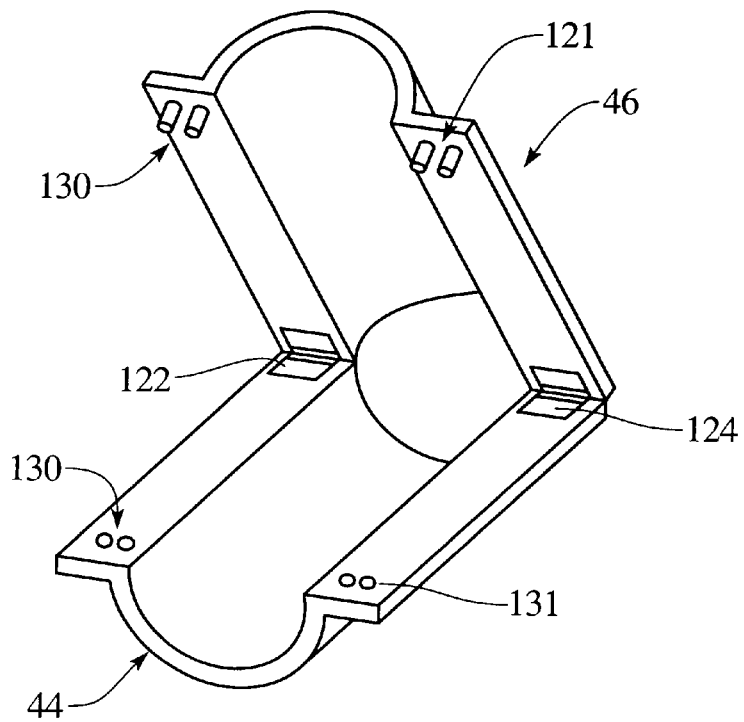

Turning now to FIGS. 8 and 9, alternative preferred embodiments for connecting the split top octapole gradient coil system according to the present invention are shown. First, with regard to FIG. 8, the bottom half gradient coil portion 44 is adapted for connection to the patient supporting surface 36 as described above and further includes a pair of left and right connection flanges 110, 112. The left and right connection flanges are adapted to slidingly engage and interlock with a corresponding set of left and right connection flanges 114, 116 formed on the top half gradient coil portion 46. The left and right connection flanges 114, 116 are adapted to lock onto the bottom left and right connection flanges using any suitable mechanical connecting means such as the hook members 118, 120 as shown. The hook members extend vertically past the left and right connection flanges 110, 112 and engage the back sides thereof in a manner substantially as shown. Of course, alternative sliding connection arrangements are possible as would be understood by those skilled in the art.

Turning to FIG. 9, an alternative split top octapole gradient coil connecting system is shown including a pair of left and right connection hinges 122, 124 which are adapted to connect the bottom and top half gradient coil portions 44, 46 in a manner substantially as shown. As described above, the bottom half gradient coil portion 44 is connected preferably to the patient supporting surface 36. The left and right hinges enable the top half gradient coil portion 46 to open in a manner as shown to permit easy patient entrance and removal from the gradient coil assembly 22.

In each of the alternative preferred split top octapole gradient coil system connecting arrangements shown in FIGS. 8 and 9, a plurality of electrical contacts 130–131 are provided on the connection flanges 110–113 in a manner to electrically connect the gradient coil members disposed on the top half gradient coil portion 46 to those disposed on the bottom half gradient coil portion 44. In the embodiment illustrated in FIG. 9, the electrical connection elements are electric contact strips for slidable mechanical and electrical engagement between the corresponding opposed contact members. In the embodiment shown in FIG. 9, the electrical contact elements are preferably pin and socket members which are adapted for intermateable connection when the top half gradient coil portion 46 is hinged into a closed position with the bottom half gradient coil portion 44.

The novel preferred method of generating a discrete transverse current density with coils arranged to define an azimuthal gap of arbitrary width will next be described. The technique is based in part on the so-called Turner energy minimization approach.

According to the present invention, an analytical expression for the azimuthal component of the current density, $J_\phi^a$ is found that both satisfies all the predetermined symmetry conditions which are in accord with the symmetry behavior of traditional transverse gradient coil geometry, and vanishes on any predetermined azimuthal ($\phi'$) location. With regard to the symmetry conditions, the current density $J_\phi^a$ is symmetric along the z direction. The current density $J_\phi^a$ is also symmetric along the z direction around the isocenter of the coil ($\phi=0°$). Therefore, the appropriate expression for $J_\phi^a$ is:

$$J_\phi^a = \cos\phi[\cos\phi - \cos\phi']\sum_{n=1}^{\infty} j_n^a \cos(k_n z) \text{ for } |z| \leq \frac{L}{2} \quad (1)$$

where $j_n^a$ are the Fourier expansion coefficients in the expression, L is the total length of the coil, $k_n=(2n\pi/L)$, and $\phi'$ represents the angle whereby $J_\phi^a$ vanishes. Using the continuity equation ($\vec{\nabla}\cdot\vec{J}=0$), the expression for the axial component of the current density is:

$$J_z^a = \sin\phi[2\cos\phi - \cos\phi']\sum_{n=1}^{\infty} \frac{j_n^a}{k_n a} \text{ for } |z| \leq \frac{L}{2} \quad (2)$$

where a is the radius of the coil in the expression. Both currents are zero for $|z|\geq L/2$.

The expression of the axial component (z) of the magnetic field for any angular dependence and at a radial position which is less than the radius a of the coil is:

$$B_z = -\frac{\mu_0 a}{2\pi}\sum_{m=-\infty}^{m=+\infty}\int_{-\infty}^{\infty} dk\, e^{im\phi+ikz} k J_\phi^a(m,k) I_m(kp) K_m(ka) S_{mab} \quad (3)$$

where $I_m(kp)K'_m(ka)$ are the modified Bessel functions of the first and second order, and $$S_{mab} = 1 - \frac{I'm(ka)K'm(kb)}{I'm(kb)K'm(ka)} \quad (4)$$

when shielding coil with radius b is present. $S_{mab}$ when only a primary coil is present.

The expression for the magnetic energy stored in the coil is:

$$W_m = \frac{\mu_0 a}{2}\sum_{m=-\infty}^{m=+\infty}\int_{-\infty}^{\infty} dk\, I'_m(ka)K'_m(ka)S_{mab}|J_\phi^a(m,k)|^2 \quad (5)$$

Considering the Fourier transform of the current density $J_\phi^a(m,k)$ $$j_\phi^a(m,k) = \frac{L}{2}\sum_{n=1}^{\infty}\psi_n(k)j_n^a \cdot \begin{cases} \frac{1}{2} & \text{for } m=0 \\ -\frac{1}{2}\cos\phi' & \text{for } m=1 \\ \frac{1}{4} & \text{for } m=2 \end{cases} \quad (6)$$

where $$\psi_n(k) = \left[\frac{\sin(k-k_n)\frac{L}{2}}{(k-k_n)\frac{L}{2}} + \frac{\sin(k+k_n)\frac{L}{2}}{(k+k_n)\frac{L}{2}}\right] \quad (7)$$

Therefore the expression of the magnetic field becomes:

$$B_z = -\frac{\mu_0 aL}{4\pi}\sum_{n=1}^{\infty} j_n^a \int_0^{+\infty} dk k\psi_n(k)\cos kz[I_0(kp)K'_0(ka)S_{0ab} + \cos 2\phi I_2(kp)K'_2(ka)S_{2ab} - 2\cos\phi\cos\phi' I_1(kp)K_1(ka)S_{1ab}] \quad (8)$$

The expression of the magnetic energy stored in the coil is:

$$W_m = -\frac{\mu_0 a^2 L^2}{16}\sum_{n=1}^{\infty}\sum_{n'=1}^{\infty} j_n^a j_{n'}^a \int_0^{\infty} dk\psi_n(k)\psi'_n(k)\left[I_0(ka)K'_0(ka)S_{0ab} + 2\cos^2\phi' I'_1(ka)K'_1(ka)S_{1ab} + \frac{1}{2}I'_2(ka)K'_2(ka)S_{2ab}\right] \quad (9)$$

Using a standard energy minimization procedure, preferably the Turner approach, the functional $\epsilon$ in terms of the stored magnetic energy and the magnetic field is constructed as:

$$\epsilon(J_n^a) = W_m - \sum_{j=1}^{N}\lambda_j\left(B_z(\vec{r}_j) - B_{zSC}(\vec{r}_j)\right) \quad (10)$$

where N represents the total number of constraint points in the expression and $B_{zSC}(\vec{r}_j)$ is the value of the gradient field at the constrain point $\vec{r}_j$. Minimizing $\epsilon$ with respect to $j_n^a$, a matrix equation for $j_n^a$, is obtained as:

$$\sum_{n'=1}^{\infty} j_{n'}^a\left\{\frac{aL\pi}{2}\int_{-\infty}^{\infty} dk\psi_n(k)\psi_{n'}(k)\right\} = \sum_{j=1}^{N}\lambda_j\int_{-\infty}^{\infty} dk k\cos kz_j \psi_n(k) \quad (11)$$

Equivalently, the matrix equation for the current density $j_n^a$ is:

$$\sum_{n'=1}^{\infty} j_{n'}^a C_{n'n} = \sum_{j=1}^{N} \lambda_j D_{jn} \quad (12)$$

Truncating the infinite summations at M terms, the matrix representation of the previous equation (12) becomes:

$$J^a C = \lambda D \text{ or } J^a = \lambda D C^{-1} \quad (13)$$

where $J^a$ is a 1×M matrix, C is a M×M matrix, $\lambda$ is a 1×N matrix and D is a N×M matrix in the expression.

The Lagrange multipliers are found using the expression of the magnetic field. The matrix representation of the magnetic field thus becomes:

$$B_z(r_j) = \sum_{n=1}^{M} j_n^a D_{jn} \text{ or } \underline{B}_z = \underline{J}^a \underline{D}^t \quad (14)$$

where $B_z$ is a 1×N matrix in the expression and the superscript t is the symbol for the transpose matrix. Replacing $J^a$ from the equation (13) to equation (14) above, the expression for the magnetic field becomes:

$$B_z = \lambda D C^{-1} D \quad (15)$$

which leads to the determination of Lagrange multipliers as:

$$\lambda = B_z [DC^{-1} D^t]^{-1} \quad (16)$$

providing that the inverse matrix for the expression $[DC^{-1}D^t]$ exists. Upon determination of Lagrange multipliers, the matrix form expression for the Fourier components of the current density is:

$$J^a = B_z [DC^{-1} D^t]^{-1} DC^{-1} \quad (17)$$

In the present invention, the expression for the Fourier components of the current for the gradient coil are solved in the straightforward manner described above. The continuous distribution of the current density for the coil is generated by substituting the Fourier components of the current back into the expression of the current density $J_\phi^a$.

Figure 10:
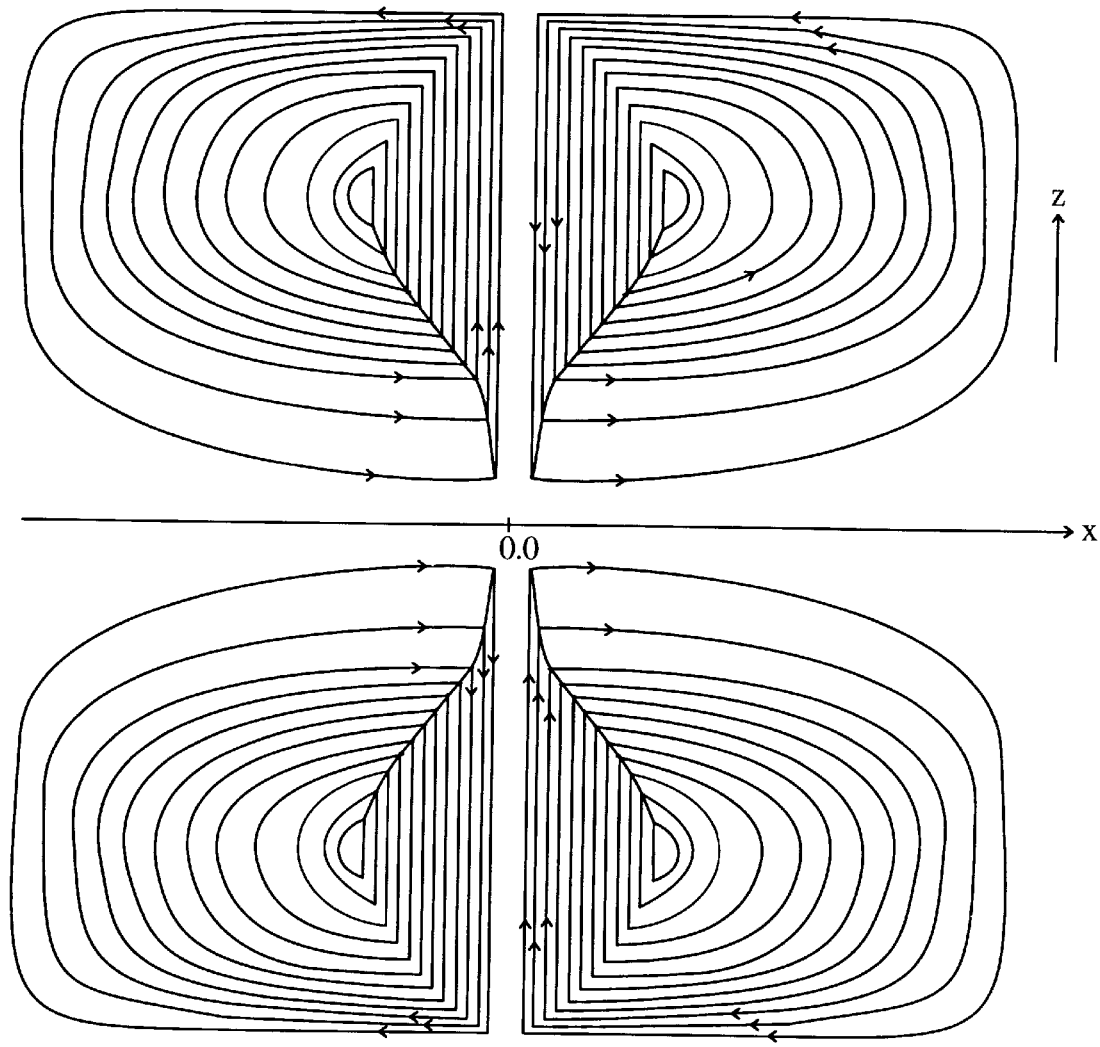
FIG. 10 is an illustration of the one-half discrete current distribution generated for an analytical model octapole X-gradient coil in accordance with the present invention.
Figure 11:
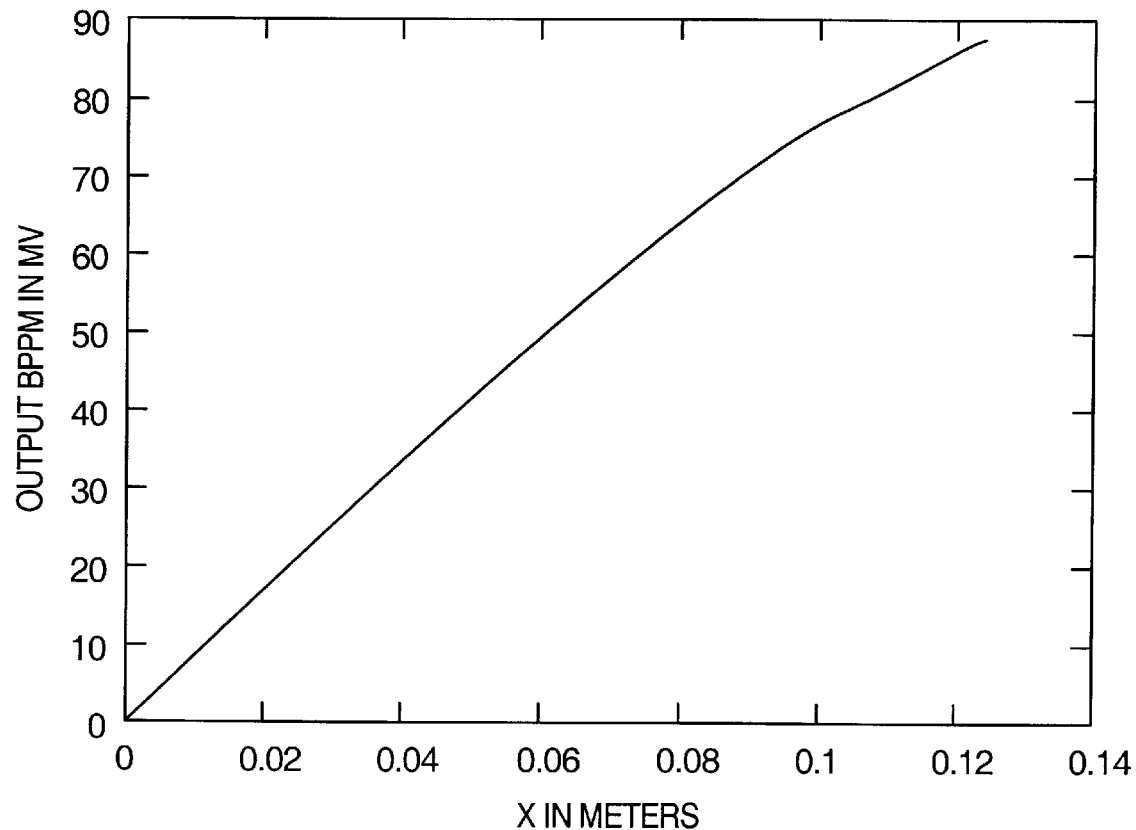
FIG. 11 shows experimental measurements of the on-axis behavior of the octapole X-gradient coil of FIG. 10 with a 3.5 cm azimuthal gap and a field strength of 24.2 mT/m at 199.53 amps.

With reference next to FIGS. 10 and 11, the design of an analytical model construction of an Octapole X-gradient coil with the azimuthal gap according to the present invention will be described. The model assumes a cylindrical radius of 191.3 mm and a total length of 60 cm. The total length of the azimuthal gap was arbitrarily selected to be 3.5 cm ($\phi'=10°$). Three constraint points were next selected to specify the quality of the gradient field inside a 23 cm DSV.

With reference to TABLE 1 below, the first constraint point sets the strength of gradient field to 24.5 mT/m, the second limits the variation of the gradient field along its gradient axis (X) to be within 15% from its ideal value at distance of 0.115 m from the geometric center of the coil, and the third constraint defines a 14% gradient field uniformity inside the 23 cm DSV.

TABLE 1

| n | $P_i$ | $Z_i$ | $B_{zsc}(n)$ |
|---|-------|-------|--------------|
| 1 | 0.0010 | 0.000 | 0.000024530 |
| 2 | 0.1150 | 0.0000 | 0.003127600 |
| 3 | 0.0010 | 0.1150 | 0.00002085050 |

Solving the inverse problem using the specific set of constraint points set forth above, the continuous current distribution for the X-gradient coil are generated. Applying the stream function technique, the discrete current pattern is obtained as shown in FIG. 11. The common value of the current for the 12 discrete loops is 199.53 Amps.

As a next step, the discrete coil pattern is used to calculate the magnetic field via the Biot-Savart law. Thus, it is ensured that the discretization mechanism is appropriate and the choice of the number of discrete loops is adequate to generate the desired quality of the magnetic field.

The gradient filed of the discrete coil pattern is very linear along its primary gradient axis (X). The net gradient field strength at the origin is 24.53 mT/m which is a 0.1% deviation from its constrained value. The linearity of the coil inside the 23 cm DSV is 17.89%.

FIG. 11 shows the level of uniformity of the gradient field inside the 23 cm DSV. Specifically, for the 12 discrete loop configuration example described here, the overall uniformity of the gradient inside the 23 cm DSV is 14%. TABLE 2 below illustrates all the properties of the octapole X-gradient coil as well as a comparison against a X-gradient coil with interstitial gap that has the same gradient strength. Comparing both gradients, it is clear that for an input current/voltage of 300 A/400 V, the slew rate of the octapole gradient coil with the azimuthal gap according to the present invention is twice as fast as the slew rate of a typical prior art X-gradient coil with the interstitial gap.

TABLE 2

| | Gradient Property at 300 A/400 V | |
|---|---|---|
| Property | OCTAPOLE COIL | INTERSTITIAL GAP COIL |
| Radius | 191.3 mm | 191.3 mm |
| Length | 60 cm | 90 cm |
| Gap | 3.5 cm | 15 cm |
| GRADIENT Str. (300 A) | 36.89 mT/m | 36.89 mT/m |
| Energy (300 A) | 7.28 J | 15.35 J |
| Linearity (23 cm DSV) | 17.49% | 8.55% |
| Uniformity (23 cm DSV) | 14% | 27% |
| Inductance | 162 $\mu$H | 341 $\mu$H |
| No. Loops | 12 | 16 |
| Resistance | 0.041 $\Omega$ | 0.055 $\Omega$ |
| Linear Rise Time (440 V) | 125 $\mu$sec | 267 $\mu$sec |
| SLEW RATE | 294 mT/m/msec | 138 mT/m/msec |

Figure 14:
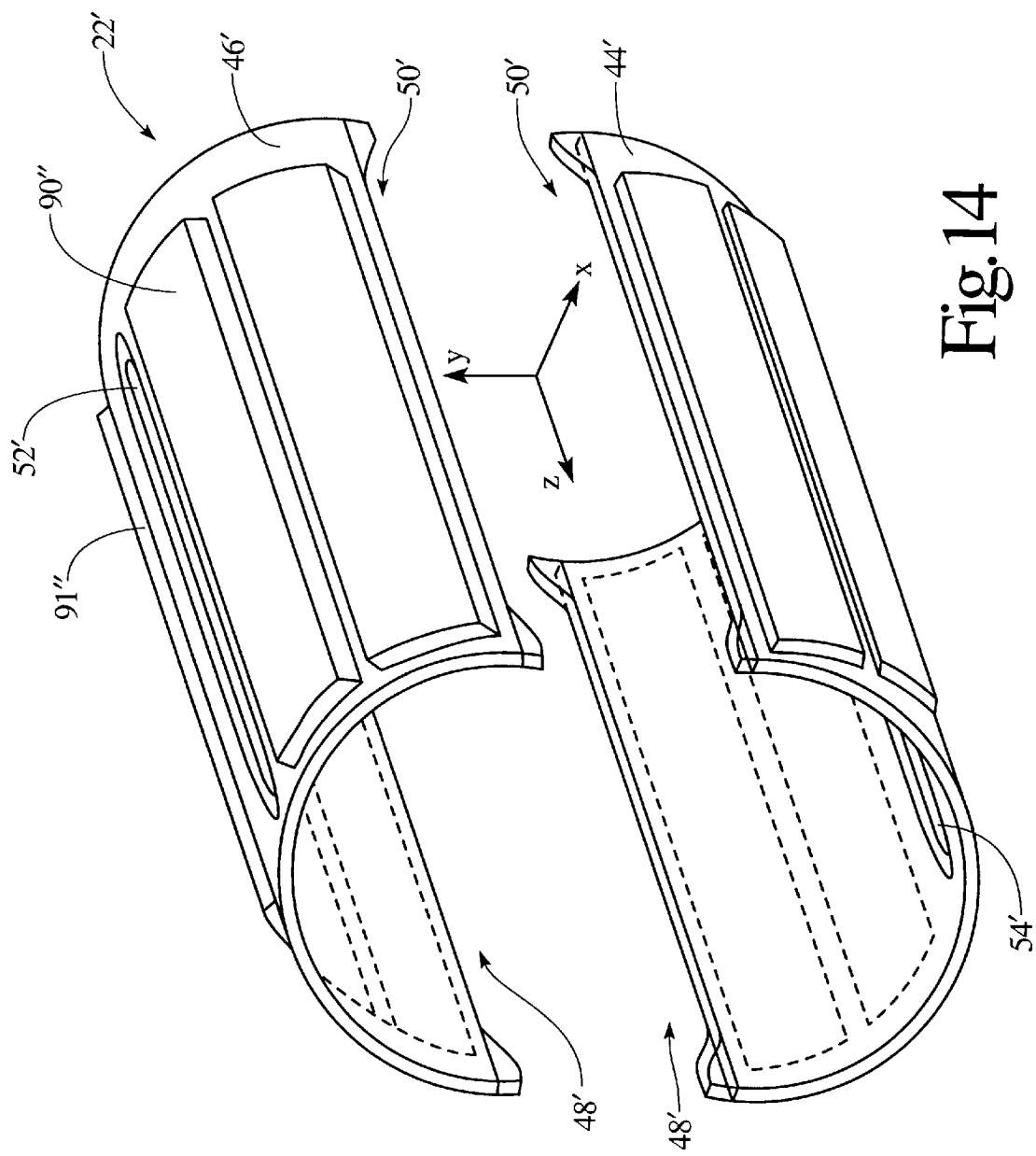
FIG. 14 is an expanded view illustrating a preferred coil arrangement of the Y-gradient coils of FIG. 13 disposed on the split top coil carrying member formed in accordance with the present invention.

Based on the discrete pattern of FIG. 10, a physical prototype X-gradient coil was constructed by applying a 12 AWG insulated wire onto a fiberglass cylindrical tube. The coil interconnects were placed on the tube in a manner that they would not interfere with the azimuthal gap. The measured inductance of the prototype coil was 158 $\mu$H at 1 kHz, which represents only a 2.5% deviation from the theoretical value. Using a search coil, the gradient field is plotted along its primary X-gradient axis as shown in FIG. 14. Furthermore, TABLE 3 below shows a comparison of the gradient field (mT/m/A) between the numerical and the experimental results at various points along the major X-gradient coil axis. It is clear that there is a very good agreement between the analytical and the measured values of the gradient field.

TABLE 3

| Position | Analytical | Experimental | Percentage Difference |
|---|---|---|---|
| 2.5 cm | 0.1227 mT/m/A | 0.1204 mT/m/A | +1.8% * |
| 5.0 cm | 0.1202 mT/m/A | 0.1223 mT/m/A | −1.7% * |
| 7.5 cm | 0.1162 mT/m/A | 0.1184 mT/m/A | −1.9% * |
| 10.0 cm | 0.1092 mT/m/A | 0.1119 mT/m/A | −2.5% * |
| 12.5 cm | 0.1023 mT/m/A | 0.10338 mT/m/A | −1.0% * |

* Indicates that the percentages are taken with respect to the theoretical values.

Figure 12:
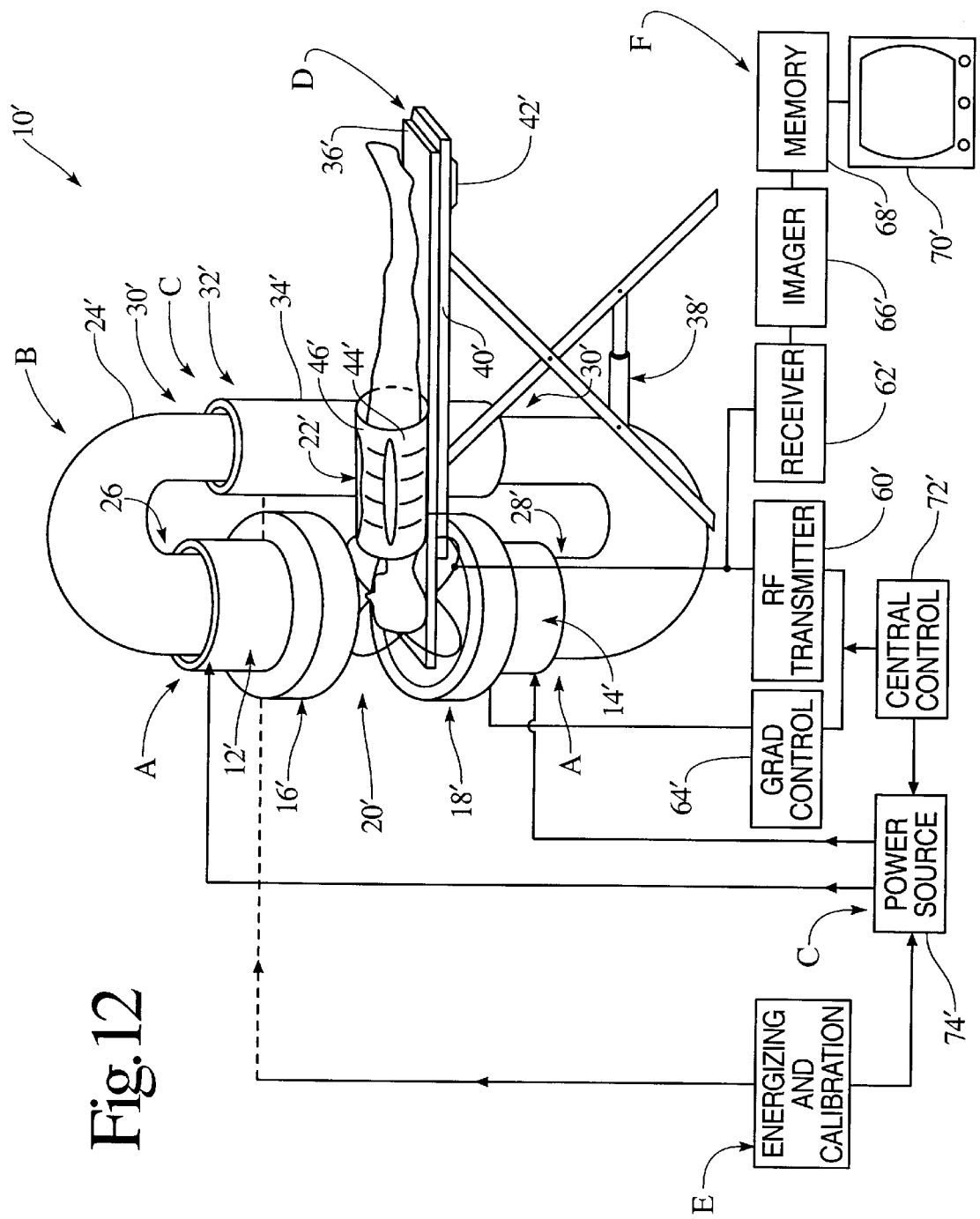
FIG. 12 is a diagrammatic illustration of a "C magnet" type magnetic resonance imaging system using the octapole gradient coil system in accordance with the present invention.

With reference next to FIG. 12, an alternative preferred embodiment of the octapole gradient coil assembly of the present invention is shown adapted for use in an open "C" magnet type system. The "C" magnet type magnetic imaging system 10' includes a magnetomotive force means A in the form of a pair of resistive magnet drivers 12', 14' disposed adjacent pole pieces 16', 18' on opposite ends of a C-shaped ferromagnetic flux path B. The magnetomotive force means A together with a magnetic flux stabilizing means C creates and stabilizes a magnetic field across an air gap 20' between the pole faces and along the ferromagnetic flux path B. A retractable patient support D selectively supports a patient or subject to be examined, together with an insertable gradient coil 22' in accordance with the present invention in the air gap 20' defined between the pole faces. An energizing and calibration system E is used to set up the magnetic field across the air gap 20'. Magnetic resonance electronics F selectively induce magnetic resonance of dipoles in the image region and process resultant received magnetic resonance signals to create an image or other diagnostic information.

The ferromagnetic flux path B includes a C-shaped ferromagnetic member 24' having a first end 26', a second end 28', and a middle portion 30'. The first pole piece 16' on the first end 26' of the flux path together with the second pole piece 18' on the second end 28' define the air gap 20' therebetween. The C-shaped member 24' is configured to minimize the length of the ferromagnetic flux path while spacing the ferromagnetic flux path sufficiently from the gap to minimize distortion to the magnetic field in the air gap.

The magnetic flux stabilizing means C includes a superconducting cryodriver 32' which encircles a segment of the middle portion 30' of the C-shaped ferromagnetic member 24'. As is well known by those skilled in the art, the cryodriver 32' includes a cryostat 34' which houses an annular superconductor magnet that encircles the flux path.

The patient support D includes a patient supporting surface 36' in a substantially horizontal plane. The supporting surface has a longitudinal axis lengthwise therealong and a perpendicular transverse axis thereacross, both in the horizontal plane. An elevation adjusting means 38' selectively adjusts the relative height of the supporting surface. The supporting surface is slidably mounted on a support frame 40' to provide a means for moving the supporting surface in the horizontal plane. Preferably, a motor drive 42' is mounted to the frame to drive the patient supporting surface therealong.

Lastly, in connection with FIG. 12, the electronics section F includes a radio frequency transmitter means 60' which selectively applies radio frequency pulses to a radio frequency coil (not shown) to excite magnetic resonance of dipoles in the gap magnetic field. A receiver 62' receives magnetic resonance signals from the region of interest using a radio frequency coil (not shown) as an antenna. A gradient coil control 64' applies electrical pulses to a gradient field coil (not shown) to cause gradients across the gap magnetic field to encode the magnetic resonance signals. An image reconstruction processor 66' performs an inverse two-dimensional Fourier transfer or other known algorithm to reconstruct an image representation from the received magnetic resonance signals. The image representations are stored in a memory 68', displayed on a video monitor 70', further processed, communicated to another apparatus, or the like. A central magnetic resonance controller 72' controls the excitation power control 74' to the resistive drivers 12', 14', the RF transmitter 60', and the gradient field control 64' to implement a preselected magnetic resonance imaging sequence as is conventional in the art.

Figure 16:
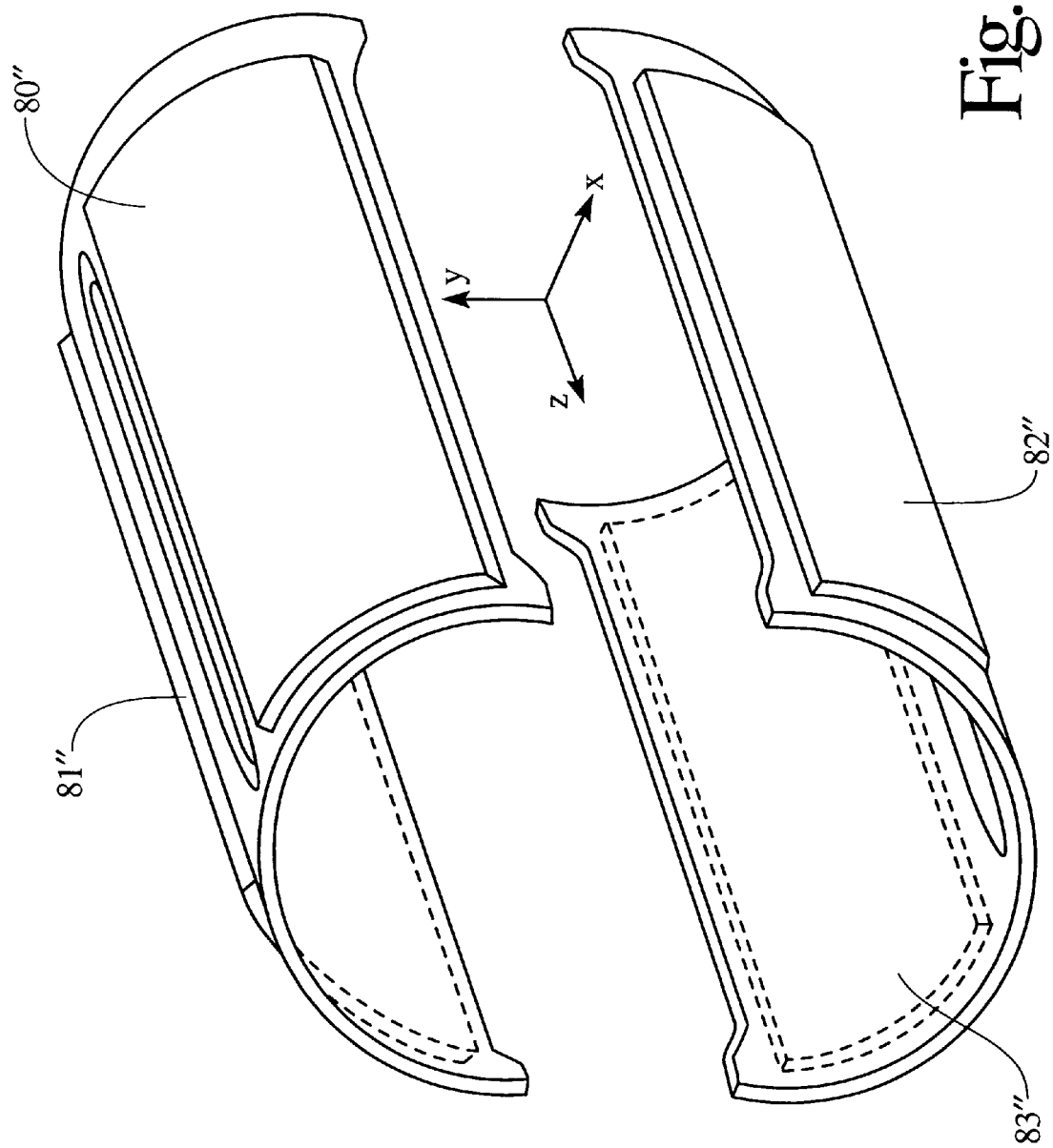

With continued reference to FIG. 12 and with addition reference to FIGS. 2, 14, and 16, the insertable gradient coil 22' is preferably formed of a bottom half gradient coil portion 44' fixedly attached to the supporting surface and a top half gradient coil portion 46' removable from the bottom half to facilitate patient receipt and exiting from the magnetic resonance imaging system 10'. A pair of left and right elongate apertures 48', 50' extend axially along the length of the insertable gradient coil 22' generally as shown to provide access to a patient received within the closed gradient coil assembly during interventional procedures or the like. In addition, a pair of top and bottom elongate apertures 52', 54' are formed in the insertable gradient coil 22' generally as shown in accordance with the present invention to further facilitate access to the patient or specimen during interventional procedures in the magnetic resonance imaging system 10'. For ease of construction, the left and right apertures 48', 50' are formed on the separation or parting line between the top and bottom half gradient coil portions 46', 44'. However, in accordance with the present invention, the apertures can be disposed in any circumferentially spaced apart manner on the gradient coil 22'.

Figure 13:
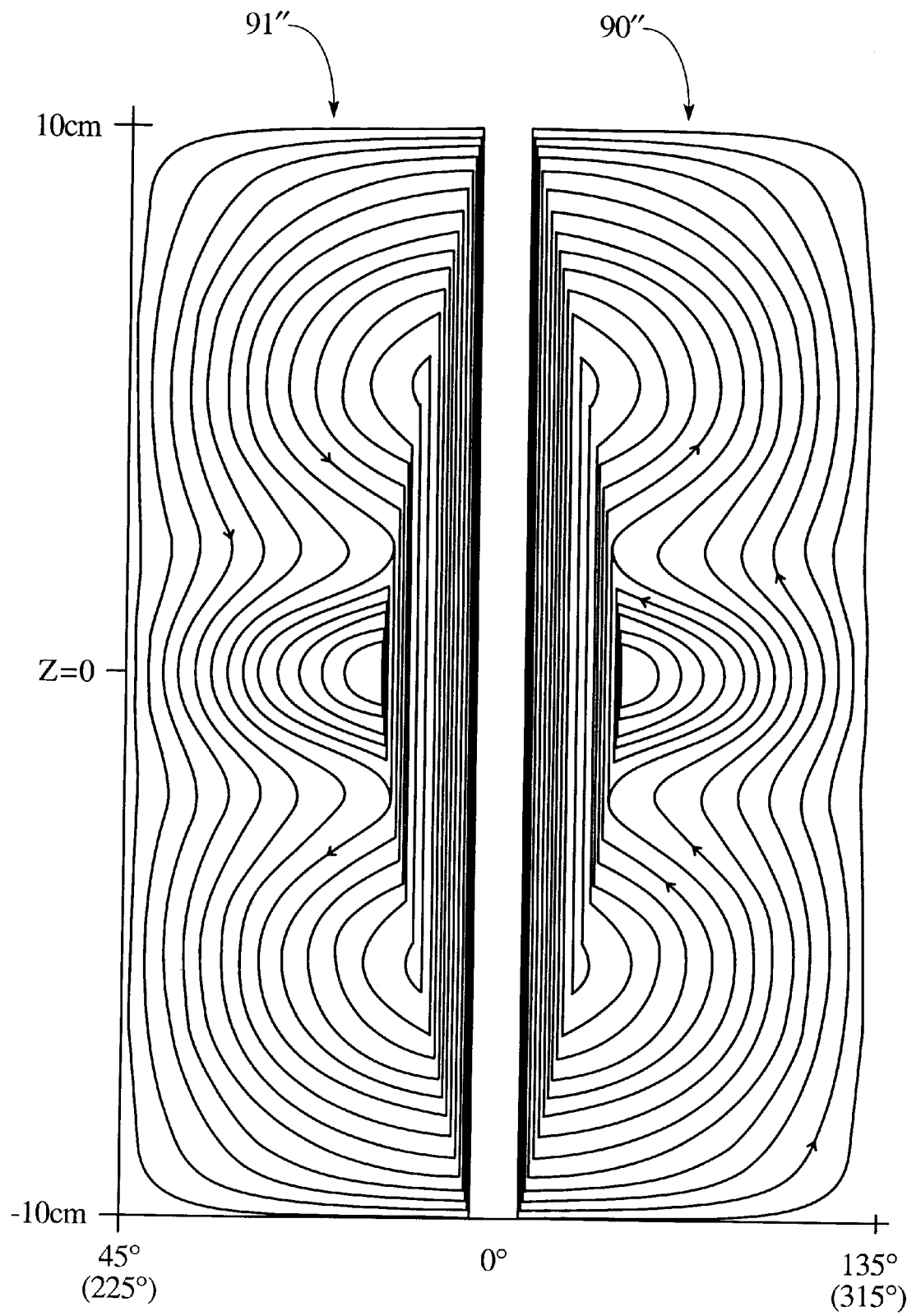
FIG. 13 is a flat illustration of a representative Y-gradient coil pattern for use with imaging apparatus as in FIG. 12 having main magnets generating vertically directed fields.
Figure 15:
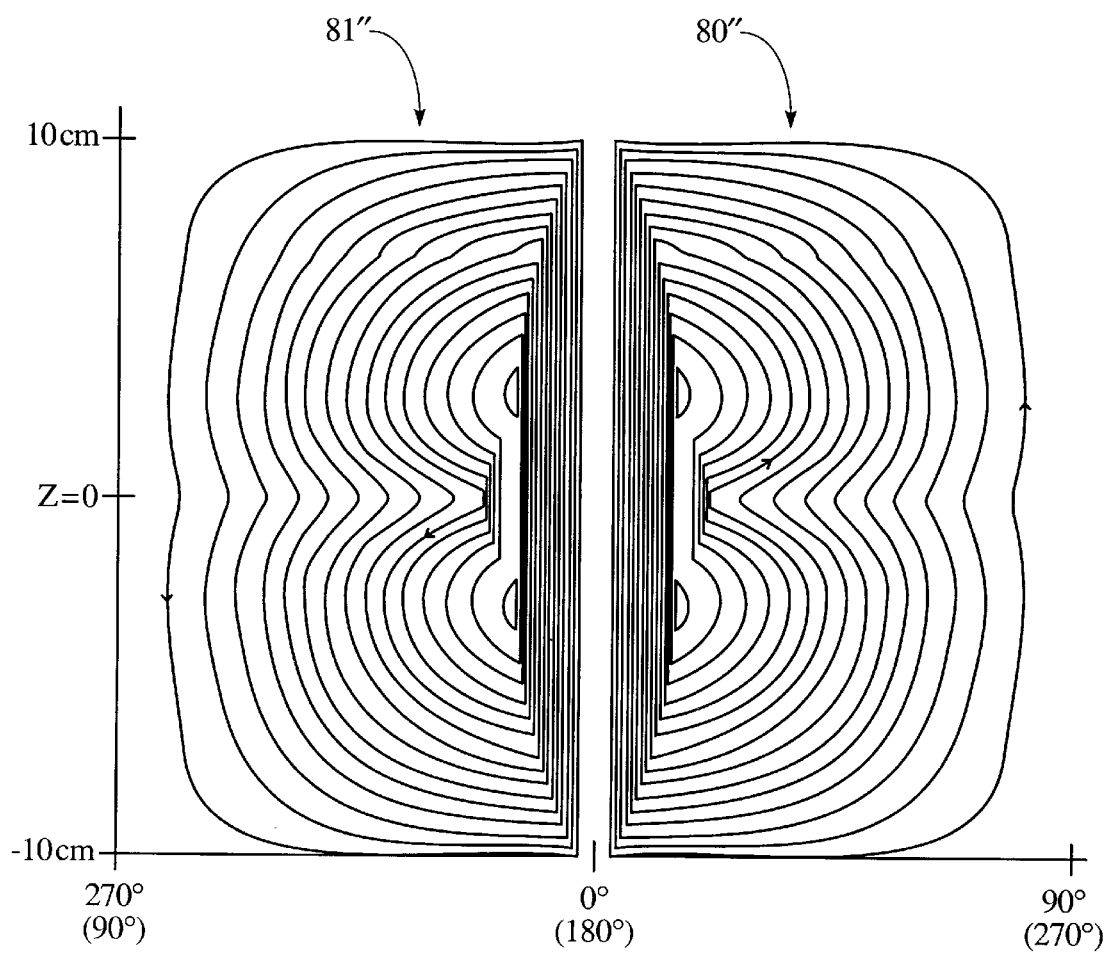
FIG. 15 is a flat illustration of a representative X-gradient coil pattern for use with imaging apparatus as in FIG. 12 having main magnets generating vertically directed fields; and, FIG. 16 is an expanded view illustrating a preferred coil arrangement of the X-gradient coils of FIG. 15 disposed on the split top coil carrying member formed in accordance with the present invention.

The top and bottom half gradient coil portions 46', 44' together carry a set X-gradient coil assemblies as illustrated in FIGS. 13 and 14 and a set of Y-gradient coil assemblies as illustrated in FIGS. 15 and 16. In the second preferred embodiment for use with imaging systems having vertically oriented main fields, the X and Y-gradient coils are arranged on the formers of the insertable gradient coil assembly substantially as shown in FIGS. 14 and 16. The Z-gradient coil is in the form of annular loops carried by the dielectric formers substantially in the manner as shown above in connection with FIG. 5. In the alternative preferred embodiment illustrated in FIGS. 13–16, the X and Y-gradient coils are constructed of copper foil laminated to the dielectric former. Electrical connectors such as metal pins and sockets, are mounted in the upper and lower former portions as described above, for providing electrical continuity between coil portions on the upper and lower coil portions when the coil members are assembled together.

With continued reference to FIGS. 13–16, each of the top and bottom half gradient coil portions 46', 44' carry four X-gradient coil members and two Y-gradient coil members, respectively. The Y-gradient coils are configured substantially as shown in FIG. 13 and are arranged on the former member as shown in FIG. 14. FIG. 13 illustrates a pair of Y-gradient coils. Two pairs of Y-gradient coils are carried on each of the top and bottom coil portions 46', 44'.

The X-gradient coils in the alternative preferred embodiment for use in vertically directed main magnetic fields is shown in FIG. 15. The X-gradient coils are disposed on the former member substantially as shown in FIG. 16. In that regard, each of the top and bottom half gradient coil portions 46', 44' carry a pair of X-gradient coil members as shown.

The invention has been described with reference to the preferred embodiments. Obviously, modifications and alterations will occur to others upon a reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A gradient coil assembly for inducing magnetic field gradients across an examination region in a magnetic resonance imaging apparatus which includes a primary magnet assembly for generating a temporarily constant magnetic field through the examination region, and a radio frequency coil for receiving resonance signals from the examination region, the gradient coil assembly comprising:

a coil carrying member carrying first and second spaced apart gradient coil portions which are physically separated from each other on the coil carrying member by at least one azimuthally directed gap having a predetermined arbitrarily selected width extending through the coil carrying member and between said first and second gradient coil portions to define an access port extending along the gradient coil assembly to provide interventional access to a patient while the patient is received within the coil assembly, the first and second coil portions being disposed in the examination region and having internal windings therein for generating gradient magnetic field components along at least two mutually orthogonal axes in the examination region.

2. The gradient coil assembly as set forth in claim 1, wherein:

the coil carrying member is substantially circularly cylindrical defining a first longitudinal axis and having an outer first circular radius;

the first gradient coil portion is substantially circularly semi-cylindrical;

the second gradient coil portion is substantially circularly semi-cylindrical; and, the at least one azimuthally directed gap extends along said first longitudinal axis of the coil carrying member.

3. The gradient coil assembly as set forth in claim 2, wherein:

the first gradient coil portion defines a top circularly semi-cylindrical shell portion of said gradient coil assembly and includes internal windings therein for generating a first portion of said gradient magnetic field components along said at least two mutually orthogonal axes in the examination region; and, the second gradient coil portion defines a bottom circularly semi-cylindrical shell portion of said gradient coil assembly intermatable with the top shell portion and includes internal windings therein for generating a second portion of said gradient magnetic field components along said at least two mutually orthogonal axes in the examination region.

4. The gradient coil assembly as set forth in claim 3, wherein:

the bottom circularly semi-cylindrical shell portion of said gradient coil assembly is adapted to be fixedly mounted to a patient support in the magnetic resonance imaging apparatus and the top circularly semi-cylindrical shell portion of said gradient coil assembly is removable from the bottom circularly semi-cylindrical shell portion, whereby the top circularly semi-cylindrical shell portion is selectively removable to facilitate patient receipt and exiting from the magnetic resonance imaging apparatus.

5. The gradient coil assembly as set forth in claim 4, wherein:

the first gradient coil portion defining said top circularly semi-cylindrical shell portion of said gradient coil assembly includes a second set of internal windings therein for generating a first portion of a third gradient magnetic field component along an axis orthogonal to said at least two mutually orthogonal axes in the examination region; and, the second gradient coil portion defining said bottom circularly semi-cylindrical shell portion of said gradient coil assembly includes a third set of internal windings therein for generating a second portion of said third gradient magnetic field component along said axis orthogonal to said at least two mutually orthogonal axes in the examination region.

6. The gradient coil assembly as set forth in claim 3, wherein:

said internal windings in the first gradient coil portion include a first set of X axis coils for generating a first X axis component of said gradient magnetic field components and a first set of Y axis coils for generating a first Y axis component of said gradient magnetic field components; and, said internal windings in the second gradient coil portion include a second set of X axis coils for generating a second X axis component of said gradient magnetic field components and a second set of Y axis coils for generating a second Y axis component of said gradient magnetic field components.

7. The gradient coil assembly as set forth in claim 6, wherein:

said first set of X axis coils of the first gradient coil portion are disposed directly onto said outer first circular radius of said coil carrying member without overlapping said first set of Y axis coils of the first gradient coil portion; and, said second set of X axis coils of the second gradient coil portion are disposed directly onto said outer first circular radius of said coil carrying member without overlapping said second set of Y axis coils of the second gradient coil portion.

8. The gradient coil assembly as set forth in claim 6, wherein:

a one of said first set of X and Y axis coils of the first gradient coil portion are disposed on said coil carrying member overlapping said the other of said first set of X and Y axis coils of the first gradient coil portion; and, a one of said second set of X and Y axis coils of the second gradient coil portion are disposed on said coil carrying member overlapping the other of said second set of X and Y axis coils of the second gradient coil portion.

9. The gradient coil assembly as set forth in claim 2, wherein said first and second gradient coil portions are physically separated from each other on the coil carrying member by a plurality of longitudinally extending azimuthally directed gaps having arbitrarily selectable widths and spaced apart around said substantially circular cylindrical coil carrying member, the plurality of azimuthally directed gaps defining a plurality of access ports to provide interventional access to the patient while the patient is received within the coil assembly.

10. The gradient coil assembly as set forth in claim 9, wherein said coil carrying member defines a plurality of patient access openings provided at locations on the coil carrying member corresponding to said plurality of longitudinally extending azimuthally directed gaps.

11. A gradient coil assembly for use in a magnetic resonance imaging apparatus of the type including a primary magnet assembly for generating a temporarily constant magnetic field through an examination region, the gradient coil assembly comprising:

an elongate substantially cylindrical coil carrying member defining a first longitudinal axis and having a first outer radius; and, a plurality of gradient field coils for generating gradient magnetic field components along at least two mutually orthogonal axes in the examination region, the plurality of gradient field coils being circumferentially spaced apart on said coil carrying member defining a first set of longitudinal gaps between the plurality of gradient field coils, each of the first set of longitudinal gaps having a predetermined arbitrary width selected to provide access to a patient while the patient is received within the gradient coil assembly.

12. The gradient coil assembly according to claim 11 wherein the coil carrying member includes a plurality of circumferentially spaced apart shell portions defining a second set of longitudinal gaps between the plurality of shell portions, each of the second set of longitudinal gaps having a predetermined arbitrary width selected to provide access to a patient while the patient is received within the gradient coil assembly.

13. The gradient coil assembly according to claim 12 wherein the first set of longitudinal gaps are coincident with said second set of longitudinal gaps.

14. The gradient coil assembly according to claim 13 wherein the plurality of gradient field coils are disposed on said plurality of circumferentially spaced apart shell portions.

15. The gradient coil assembly according to claim 14 wherein the plurality of gradient field coils are disposed on said plurality of circumferentially spaced apart shell portions at said first radius.

* * * * *